(12) United States Patent
Fujita

(10) Patent No.: US 6,172,730 B1
(45) Date of Patent: Jan. 9, 2001

(54) LIQUID CRYSTAL DISPLAY APPARATUS HAVING STEPPED SECTION IN GLASS SUBSTRATE

(75) Inventor: Akira Fujita, Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/262,867

(22) Filed: Mar. 5, 1999

(30) Foreign Application Priority Data

Mar. 6, 1998 (JP) ................................ 10-055235

(51) Int. Cl.⁷ .................... G06F 1/1345; G06F 1/1333
(52) U.S. Cl. .................... 349/149; 349/152; 349/138; 349/158
(58) Field of Search .................... 349/199, 150, 349/152, 138, 158

(56) References Cited

U.S. PATENT DOCUMENTS

| | | | |
|---|---|---|---|
| 4,409,836 | * 10/1983 | Kikuno | 349/152 |
| 4,930,876 | * 6/1990 | Suzuki et al. | 349/152 |
| 5,317,438 | 5/1994 | Suzuki et al. | 399/15 |
| 5,528,403 | * 6/1996 | Kawaguchi et al. | 349/149 |

FOREIGN PATENT DOCUMENTS

| | | |
|---|---|---|
| 5-72545 | 3/1993 | (JP) . |
| 6-235928 | 8/1994 | (JP) . |
| 7-321152 | 12/1995 | (JP) . |
| 8-76073 | 3/1996 | (JP) . |
| 8-138774 | 5/1996 | (JP) . |
| 9-127536 | 5/1997 | (JP) . |

OTHER PUBLICATIONS

Patent Abstracts of Japan, vol. 095, No. 001, Feb. 28, 1995.
Patent Abstracts of Japan, vol. 096, No. 004, Apr. 30, 1996.
Patent Abstracts of Japan, vol. 442 I{–1109), Sep. 20, 1990.

* cited by examiner

*Primary Examiner*—William L. Sikes
*Assistant Examiner*—Toan Ton
(74) *Attorney, Agent, or Firm*—Sughrue, Mion, Zinn, Macpeak & Seas, PLLC

(57) ABSTRACT

In a liquid crystal display apparatus, a glass substrate has connection terminals and a stepped section at an edge thereof. A liquid crystal display panel is mounted on the glass substrate and is electrically connected to the connection terminals. A flexible printed board has leads and an insulating layer partly covering the leads. The connection terminals are adhered by a conductive adhesive agent to the leads, so that the stepped section of the glass substrate receives an edge of the insulating layer.

4 Claims, 6 Drawing Sheets

LIQUID CRYSTAL DISPLAY APPARATUS HAVING STEPPED SECTION IN GLASS SUBSTRATE

BACKGROUND OF THE INVENTION

1. Field of the Invention

The present invention relate to a liquid crystal display (LCD) apparatus, and more particularly, to the alignment of a flexible printed board with a glass substrate.

2. Description of the Related Art

Generally, an LCD apparatus is constructed by a glass substrate, an LCD panel mounted on the glass substrate, and a flexible printed board adhered to the glass substrate. The flexible printed board drives the LCD panel. Therefore, the flexible printed board has leads electrically connected to the LCD panel and an insulating layer partly covering the leads.

In a first prior art LCD apparatus, connection terminals are formed along edges of the glass substrate. The leads of the flexible printed board are connected to the connection terminals by a thermocompression bonding process using a thermosetting conductive adhesive agent. When connecting the leads of the flexible printed board to the connection terminals of the glass substrate, the conductive adhesive agent is heated while the flexible printed board is lowered under pressure until they are connected with each other. This will be explained later in detail.

In the above-described first prior art LCD apparatus, however, while the leads and the insulating layer are located respectively at different levels on the flexible printed board, the connection terminals of the glass substrate are on the same plane as the compression bonding surface at the time of the thermocompression bonding process, so that the insulating layer is inevitably located off the edge of the glass substrate. Therefore, the leads of the flexible printed board are left uncovered and exposed to the atmosphere, resulting in conductive contaminant adhered to the exposed leads, which may by turn give rise to a short-circuiting therein.

In a second prior art LCD apparatus (see JP-A-5-72545 & JP-A-8-138774), an about 0.3 to 1.0 mm width beveled section is formed along the edge of the glass substrate. As a result, when the conductive adhesive agent is forced off the edge of the glass substrate by the thermocompression bonding process, squeezed adhesives is received in the beveled section. Therefore, the leads of the flexible printed board are completely covered by the adhesive agent, thus avoiding a short-circuit between the leads of the flexible printed board. This also will be explained later in detail.

In the above-described second prior art LCD apparatus, however, since it is difficult to closely control the flow of the conductive adhesive agent, and also the location of the edge of the insulating layer fluctuates, the exposed leads of the flexible printed board may not be covered satisfactorily. In addition, since the part of the conductive adhesive agent that is forced off will simply remain by chance on the beveled section of the glass substrate, when subjected to stress due to external force or made to become brittle for some reason or other, the part of the conductive adhesive agent can easily come off the beveled section of the glass substrate, to thereby affect the operation of the LCD apparatus as foreign objects blocking the back light.

SUMMARY OF THE INVENTION

It is an object of the present invention to provide an LCD apparatus and its manufacturing method that can effectively protect the exposed leads of the flexible printed board and suppress any possible production of a foreign object that can block the back light.

According to the present invention, in an LCD apparatus, a glass substrate has connection terminals and a stepped section at an edge thereof. An LCD panel is mounted on the glass substrate and is electrically connected to the connection terminals substrate. A flexible printed board has leads and an insulating layer partly covering the leads. The connection terminals are adhered by a conductive adhesive agent to the leads, so that the stepped section of the glass substrate receives an edge of the insulating layer.

Also, in a method for manufacturing an LCD panel apparatus, a glass substrate having connection terminals is prepared. Then, a stepped section is formed at an edge of the glass substrate and adjacent to the connection terminals. Then, an LCD is mounted on the glass substrate. In this case, the liquid crystal display panel is electrically connected to the connection terminals. Then, a conductive adhesive agent is coated on the connection terminals. Then, a flexible printed board having leads and an insulating layer partly covering the leads is placed on the glass substrate, so that the leads face the connection terminals, and an edge of the insulating layer faces the stepped section of the glass substrate. Then, pressure is applied to the flexible printed board and the glass substrate, so that the leads are electrically connected via the conductive adhesive agent to the connection terminals.

If the conductive adhesive agent is made of thermosetting conductive adhesive, the conductive adhesive agent is heated while the pressure is applied.

If the conductive adhesive agent is made of ultraviolet-ray-setting conductive adhesive, the conductive adhesive agent is irradiated with ultraviolet rays while the pressure is applied.

BRIEF DESCRIPTION OF THE DRAWINGS

The present invention will be more clearly understood from the description as set forth below, as compared with the prior art, with reference to the accompanying drawings, wherein.

DESCRIPTION OF THE PREFERRED EMBODIMENT

Before the description of the preferred embodiment, prior art LCD apparatuses will be explained with reference to FIGS. 1 and 2.

Figure 1:
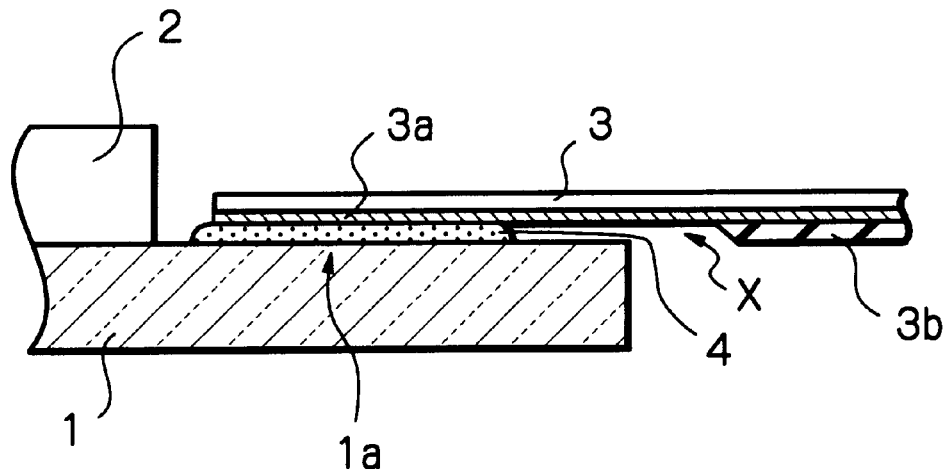
FIG. 1 is a cross-sectional view illustrating a first-prior art LCD apparatus.

In FIG. 1, which is a cross-sectional view illustrating a first prior art LCD apparatus, reference numeral 1 designates a glass substrate on which an LCD panel 2 is mounted. Note that thin film transistors (TFTs), color filters and the like are formed on the LCD panel 2. Also, a flexible printed board 3 as an external driving circuit section having leads 3a printed thereon and an insulating layer 3b partly covering the leads 3a is mounted on the glass substrate 1, and is electrically connected to the LCD panel 2. Note that the flexible printed board 3 is constructed by a tape carrier package (TCP).

In more detail, connection terminals 1a are formed along edges of the glass substrate 1. The leads 3a of the flexible printed board 3 are connected to the connection terminals 1a by a thermocompression bonding process using a thermosetting conductive adhesive agent 4. The conductive adhesive agent 4 is an anisotropic conductive adhesive agent adapted to realize electrical connection by means of resin filled with conductive granules, which resin will be molten and flow away when heated, leaving the conductive granules behind.

When connecting the leads 3a of the flexible printed board 3 to the connection terminals 1a of the glass substrate 1, the electoconductive adhesive agent 4 is heated while the flexible printed board 3 is lowered under pressure until they are connected with each other.

In the LCD apparatus of FIG. 1, however, while the leads 3a and the insulating layer 3b are located respectively at different levels on the flexible printed board 3, the connection terminals 1a of the glass substrate 1 are on the same plane as the compression bonding surface at the time of thermocompression bonding process, so that the insulating layer 3b is inevitably located off the edge of the glass substrate 1. Therefore, the leads 3b of the flexible printed board 3 are left uncovered and exposed to the atmosphere as indicated by X in FIG. 1, resulting in conductive contaminant adhered to the exposed leads 3a, which may by turn give rise to a short-circuiting therein.

Figure 2:
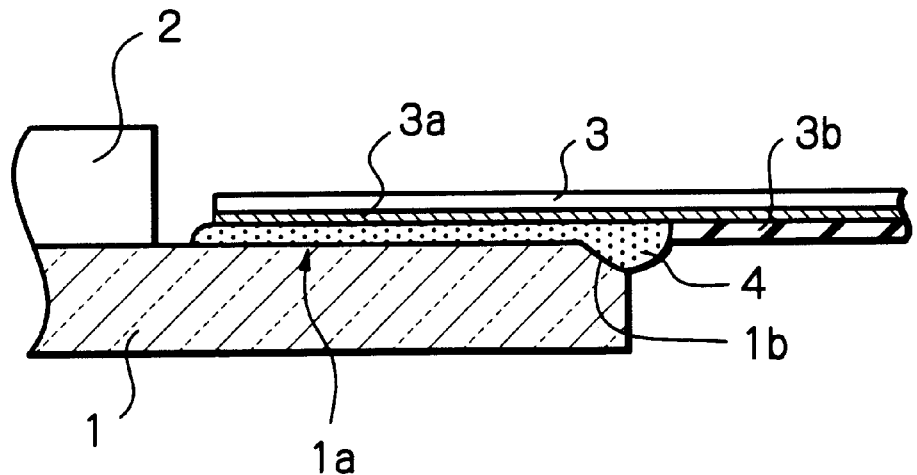
FIG. 2 is a cross-sectional view illustrating a second prior art LCD apparatus.

In FIG. 2, which is a cross-sectional view illustrating a second prior art LCD apparatus (see JP-A-5-72545 & JP-A-8-138774), an about 0.3 to 1.0 mm width beveled section 1b is formed along the edge of the glass substrate 1. As a result, when the conductive adhesive agent 4 is forced off the edge of the glass substrate 1 by the thermocompression bonding process, and the squeezed adhesives are received in the beveled section 1b. Therefore, the leads 3a of the flexible printed board 3 is completely covered by the adhesive agent 4, thus avoiding the short-circuit between the leads 3a of the flexible printed board 3.

In the LCD apparatus of FIG. 2, however, since it is difficult to closely control the flow of the conductive adhesive agent 4, and also the edge location of the insulating layer 3b fluctuates, the exposed leads 3a of the flexible printed board 3 may not be covered satisfactorily. In addition, since the part of the conductive adhesive agent 4 that is forced off will simply remain by chance on the beveled section 1b of the glass substrate 1 as no means is provided to hold the part of the adhesive agent 3 there, when subjected to stress due to external force or made to become brittle for some reason or other, the part of the conductive adhesive agent 3 can easily come off the beveled section 1b of the glass substrate 1, to thereby affect the operation of the LCD apparatus as foreign objects blocking the back light.

An embodiment of the method for manufacturing an LCD apparatus will be explained next with reference to FIGS. 3A, 3B, 3C 3D and 3E.

Figure 3A:
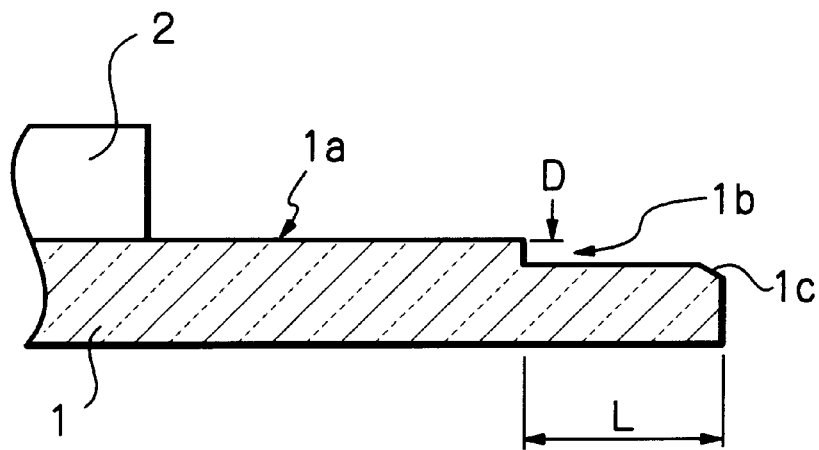
FIGS. 3A, 3B, 3C, 3D and 3E are cross-sectional views illustrating an embodiment of the method for manufacturing an LCD apparatus according to the present invention.

First, referring to FIG. 3A, a glass substrate 1 having connection terminals 1a thereon is polished to form a stepped section 1b having a depth D and a length L along the edge of the glass substrate 1. Then, an LCD panel 2 is mounted on the glass substrate 1. In this case, the LCD panel 2 is electrically connected to the connection terminals 3a.

Note that the edge of the outer extremity 1c of the stepped section 1b may be appropriately beveled.

Figure 3B:
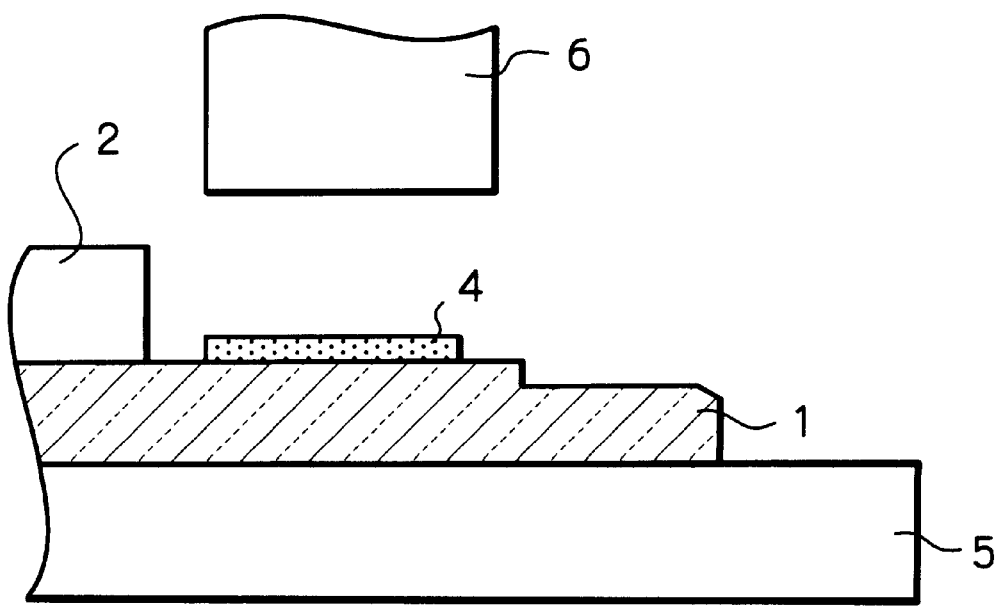

Next, referring to FIG. 3B, the glass substrate 1 is placed on a support table 5. Then, a thermosetting, anisotropic conductive adhesive agent 4 is provisionally-compression bonded on to the connection terminals 1a. Note that reference numeral 6 designates a compression bonding head.

Figure 3C:
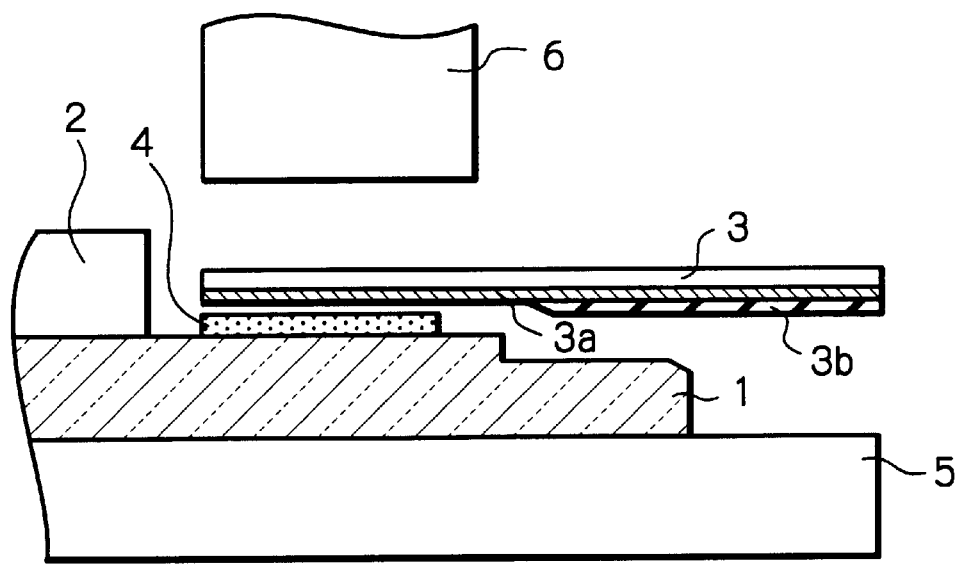

Next, referring to FIG. 3C, a flexible printed board 2 having leads 2a and an insulating layer 2b partly covering the leads 2a is positioned on the glass substrate 1. In this case, the leads 2a face the conductive adhesive agent 4 i.e., the connection terminal 1a and the edge of the insulating layer 2b faces the stepped section 1b of the glass substrate 1.

Figure 3D:
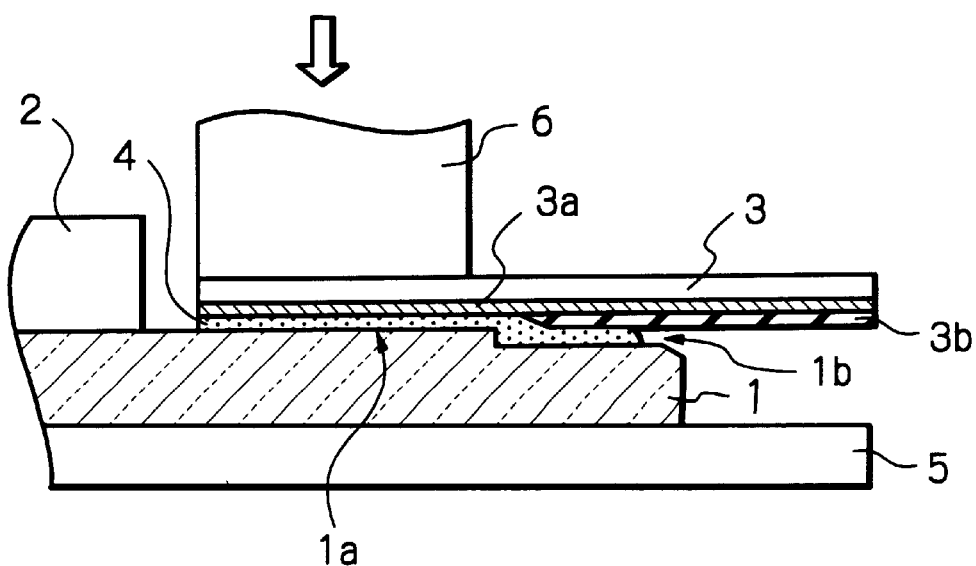

Next, referring to FIG. 3D, the compression bonding head 6 is pressed against the aligned leads 3a of the flexible printed board 3 and the connection terminals 1a of the glass substrate 1. Simultaneously, the conductive adhesive agent 4 is subjected to thermo-compression bonding at a temperature and pressure suitable for it to be thermoset in order to electrically connect the leads 3a to the connection terminals 1a. In this case, some of the resin of the conductive adhesive agent 4 is softened by the thermo-compression bonding process and flows onto the stepped section 1b of the glass substrate 1. The resin within the stepped section 1b becomes hardened and is sandwiched by the glass substrate 1 and insulating layer 3b of the flexible printed board 3.

Figure 3E:
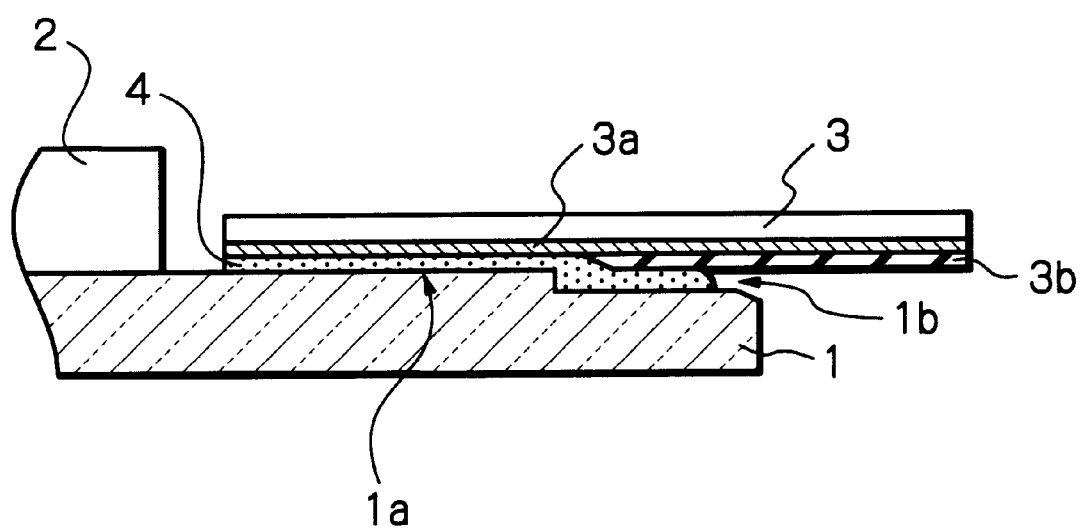

Finally, referring to FIG. 3E, the compression bonding head 6 and the support table 5 are removed. Thus, when the leads 3a of the flexible printed board 3 are aligned with the connection terminals 1a of the glass substrate 1, the stepped section 1b of the glass substrate 1 receives the insulating layer 3b of the flexible printed board 3.

The depth D of the stepped section 1b is so selected as to appropriately receive any excess portion of the conductive adhesive agent 3 as well as receive the insulating layer 3b. For example, the depth D is dimensioned to be $$20\ \mu m \leq D \leq 60\ \mu m$$

On the other hand, the length L of the stepped section 1b is so selected as to appropriately conceal the exposed leads 3a and the edge of the insulating layer 3b. For example, the length L is dimensioned to be $$0.3\ mm \leq L \leq 0.5\ mm$$

The depth D of the stepped section 1b of the glass substrate 1 will be explained with reference to FIGS. 4A and 4B. Here, the thickness of the insulating layer 3b is about 5 to 20 $\mu m$, and the adhesive agent 4 is about 10 to 30 $\mu m$ before the thermo-compressing bonding process.

Figure 4A:
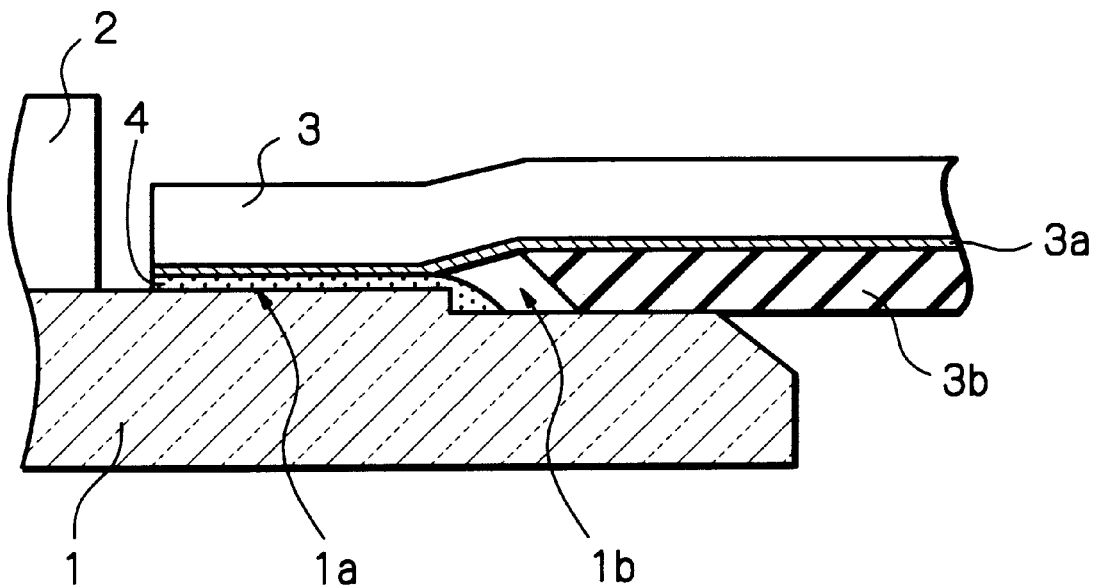
FIGS. 4A, 4B, 5A and 5B are cross-sectional views for explaining the dimensions of the stepped section of the LCD apparatus of FIGS. 3A, 3B, 3C, 3D and 3E.

If the depth D of the stepped section 1b is smaller than the thickness of the insulating layer 3b as illustrated in FIG. 4A, the leads 3a will be swerved between the edge of the stepped section 1b of the glass substrate 1 and the edge of the insulating layer 3b. As a result, the leads 3a of the flexible printed board 3 may be subjected to concentrated local stress after the thermo-compression bonding process. Therefore, the leads 3a of the flexible printed board 3 may become broken or fall into some other faulty conditions when the leads 3a of the flexible printed board 3 are subjected to additional stress due to external force such as vibration.

Thus, in order to avoid the generation of swerved portions of the leads 3a, the depth D is preferably larger than the thickness of the insulating layer 3b. For example, as state above, $$D \geq 20\ \mu m$$

Figure 4B:
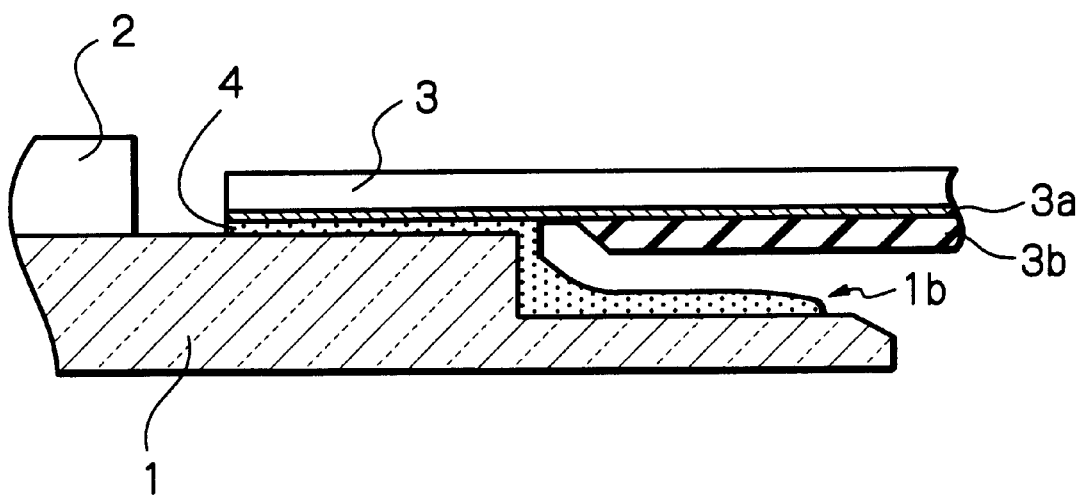

On the other hand, if the depth D of the stepped section 1b is larger than the thickness of the insulating layer 3b as illustrated in FIG. 4B, it will no longer be possible for the regin of the adhesive agent 4 flowing out as a result of the thermo-compression bonding process to completely fill the stepped section 1b of the glass substrate 1. As a result, a gap G will be formed between the insulating layer 3b and the glass substrate 1 to partly expose the leads 3a of the flexible printed board 3 through the gap G.

Thus, in order to avoid the generation of the gap G, the depth D is preferably smaller than thrice the thickness of the insulating layer 3b. For example, as stated above, $$D \leq 60 \ \mu m$$

Figure 5A:
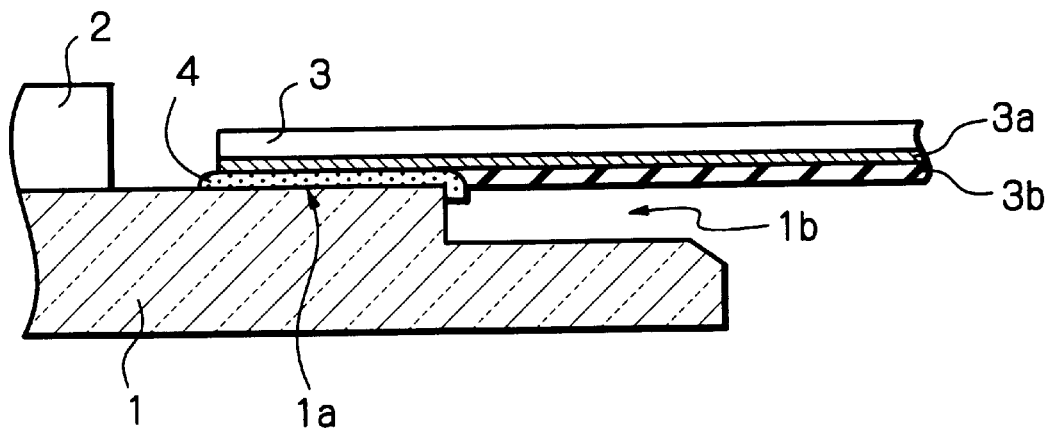
Figure 5B:
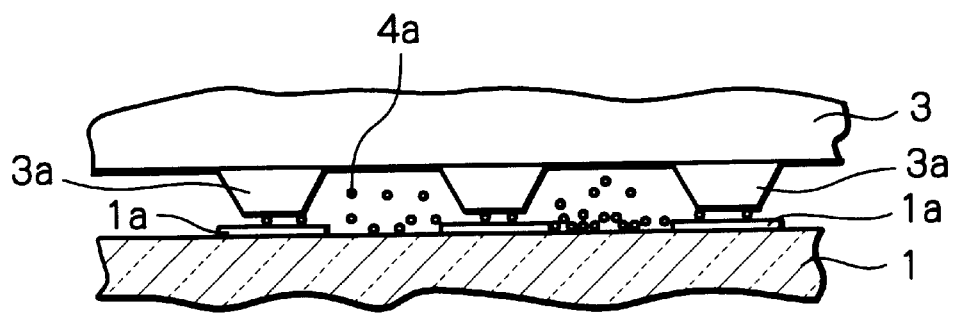
Figure 5C:
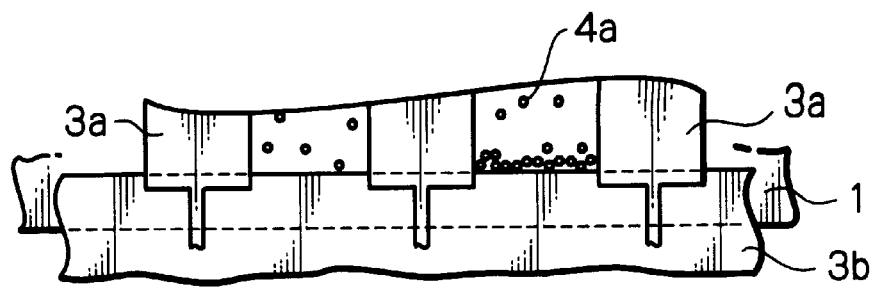
FIG. 5C is a plan view of FIG. 5B.

The length L of the stepped section 1b of the glass substrate 1 will be explained next with reference to FIGS. 5A, 5B and 5C. Here, FIG. 5B is an enlargement of the connection terminals 1a and the leads 3a of FIG. 5A, and FIG. 5C is a plan view of FIG. 5B. Also, the precision of the thickness of the insulating layer 3b is ±0.1 to 0.2 mm.

As illustrated in FIG. 5A, if the length L of the stepped section 1b is too small, the insulating layer 3b serves as a dam of the stepped section 1b for blocking the flow path of the molten resin of the thermally softened adhesive agent 4 in the thermo-compression bonding process. As a result, as illustrated in FIGS. 5B and 5C, the conductive granules 4a of the conductive adhesive agent 4 may coagulate to short-circuit the exposed leads 3a.

On the other hand, if the length L of the stepped section 1b is too large, the glass substrate 1 shows excessly large peripheral dimensions so that the LCD apparatus will be made too large for no good reason.

Now, the length L of the stepped section 1b is required to accommodate at least the minimal deviation of 0.2 mm for the insulating layer 3b and the distance of 0.1 mm between the end surface of the insulating layer 3b and the side wall of the stepped section 1b. On the other hand, it is not required to accommodate more than the maximal deviation of 0.4 mm for the insulating layer 3b and the distance of 0.1 mm between the end surface of the insulating layer 3b and the side wall of the stepped section 1b.

In view of the above circumstances, as stated above, the length L of the stepped section 1b is preferably dimensioned to be 0.3 mm $\leq$ L2 $\leq$ 0.5 mm.

In the above-described embodiment, the conductive adhesive agent 4 can be obtained by adding conductive granules to ultraviolet-ray-setting type resin. In this case, the conductive adhesive agent 4 containing ultraviolet-ray-setting type resin is applied in advance to the entire surface of the stepped section 1b to a thickness of about 10 to 30 $\mu$m. When electrically connecting the leads 3a of the flexible printed board 3 and the connection terminals 1a of the glass substrate 1 by means of the conductive adhesive agent 4, ultraviolet rays are irradiated onto the conductive adhesive agent 4 while the latter is subjected to pressure applied by the compression bonding head 6. As a result, the conductive adhesive agent 4 applied to the entire surface of the stepped section 1b is hardened so that the exposed leads 3a of the flexible printed board 3 are concealed by the stepped section 1b.

As explained hereinabove, according to the present invention, since the leads of the flexible printed board would not be exposed to the outside, any short-circuiting can be reliably prevented from occurring to the leads due to the foreign objects adhering thereto. Also, any excess conductive adhesive agent is received by the stepped section and covers the corresponding edges of the leads the insulating layer of the flexible printed board to further protect the leads against short-circuiting due to the foreign objects adhering thereto. Further, since the forced-out conductive adhesive agent is accommodated on the stepped section, it would not be peeled off to block the back light as a foreign object to reduce the characteristics of the LCD apparatus.

What is claimed is:

1. A liquid crystal display apparatus comprising:

a glass substrate having connection terminals and a stepped section at an edge of said glass substrate;

a liquid crystal display panel mounted on said glass substrate and electrically connected to said connection terminals; and a flexible printed board having leads and an insulating layer partly covering said leads, said connection terminals being adhered by a conductive adhesive agent to said leads, so that said stepped section of said glass substrate receives an edge of said insulating layer.

2. The apparatus as set forth in claim 1, wherein said stepped section has a depth dimensioned to receive any excess portion of said conductive adhesive agent, said depth being larger than a thickness of said insulating layer.

3. The apparatus as set forth in claim 1, wherein said stepped section has a length dimensioned to conceal a part of said leads not facing said connection terminals and the edge of said insulating layer.

4. The apparatus as set forth in claim 1, wherein said stepped section has a depth dimensioned to be approximately between 20 $\mu$m and 60 $\mu$m and a length dimensioned to be approximately between 0.3 mm and 0.5 mm.

* * * * *